US009065722B2

(12) United States Patent
Thottethodi et al.

(10) Patent No.: US 9,065,722 B2
(45) Date of Patent: Jun. 23, 2015

(54) DIE-STACKED DEVICE WITH PARTITIONED MULTI-HOP NETWORK

(71) Applicant: Advanced Micro Devices, Inc., Sunnyvale, CA (US)

(72) Inventors: Mithuna S. Thottethodi, Bellevue, WA (US); Gabriel H. Loh, Bellevue, WA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 257 days.

(21) Appl. No.: 13/726,142

(22) Filed: Dec. 23, 2012

(65) Prior Publication Data
US 2014/0177626 A1  Jun. 26, 2014

(51) Int. Cl.
| | |
|---|---|
| *G06F 17/50* | (2006.01) |
| *H04L 12/755* | (2013.01) |
| *H01L 23/48* | (2006.01) |
| *H01L 23/538* | (2006.01) |
| *H01L 25/065* | (2006.01) |
| *H04L 12/701* | (2013.01) |
| *H01L 25/18* | (2006.01) |

(52) U.S. Cl.
CPC .......... *H04L 45/021* (2013.01); *G06F 17/5068* (2013.01); *H01L 2224/16225* (2013.01); *H01L 2924/15192* (2013.01); *H01L 23/481* (2013.01); *H01L 23/5384* (2013.01); *H01L 23/5389* (2013.01); *H01L 25/0652* (2013.01); *H04L 45/00* (2013.01); *H01L 2924/1461* (2013.01); *H01L 25/18* (2013.01); *H01L 2225/06517* (2013.01); *H01L 2225/06513* (2013.01); *H01L 2225/06541* (2013.01)

(58) Field of Classification Search
None
See application file for complete search history.

(56) References Cited

U.S. PATENT DOCUMENTS

| | | | |
|---|---|---|---|
| 6,189,065 | B1 | 2/2001 | Arndt et al. |
| 6,519,674 | B1 | 2/2003 | Lam et al. |
| 7,477,535 | B2 | 1/2009 | Lahtinen et al. |
| 7,796,446 | B2 | 9/2010 | Ruckenbauer et al. |
| 7,930,661 | B1 | 4/2011 | Trimberger et al. |
| 8,233,303 | B2 | 7/2012 | Best et al. |
| 8,356,138 | B1 | 1/2013 | Kulkarni et al. |
| 8,423,789 | B1 | 4/2013 | Poo et al. |
| 8,451,014 | B2 | 5/2013 | Black et al. |

(Continued)

OTHER PUBLICATIONS

International Search Report and Written Opinion correlating to PCT/US13/075956 dated May 9, 2014, 13 pages.

(Continued)

*Primary Examiner* — Leigh Garbowski

(57) ABSTRACT

An electronic assembly includes horizontally-stacked die disposed at an interposer, and may also include vertically-stacked die. The stacked die are interconnected via a multi-hop communication network that is partitioned into a link partition and a router partition. The link partition is at least partially implemented in the metal layers of the interposer for horizontally-stacked die. The link partition may also be implemented in part by the intra-die interconnects in a single die and by the inter-die interconnects connecting vertically-stacked sets of die. The router partition is implemented at some or all of the die disposed at the interposer and comprises the logic that supports the functions that route packets among the components of the processing system via the interconnects of the link partition. The router partition may implement fixed routing, or alternatively may be configurable using programmable routing tables or configurable logic blocks.

16 Claims, 5 Drawing Sheets

(56) References Cited

U.S. PATENT DOCUMENTS

| | | | |
|---|---|---|---|
| 8,519,739 | B1 | 8/2013 | Leon |
| 8,546,955 | B1* | 10/2013 | Wu .............................. 257/777 |
| 8,700,951 | B1 | 4/2014 | Call et al. |
| 8,778,734 | B2* | 7/2014 | Metsis .......................... 438/109 |
| 2004/0153902 | A1 | 8/2004 | Machado et al. |
| 2006/0164882 | A1 | 7/2006 | Norman |
| 2008/0066302 | A1 | 3/2008 | Chung |
| 2008/0320346 | A1 | 12/2008 | Lin |
| 2009/0017580 | A1 | 1/2009 | Smith |
| 2009/0055596 | A1 | 2/2009 | Wallach et al. |
| 2009/0103345 | A1 | 4/2009 | McLaren et al. |
| 2009/0190404 | A1 | 7/2009 | Roohparvar |
| 2009/0313483 | A1 | 12/2009 | Ranade |
| 2010/0005118 | A1 | 1/2010 | Sezer |
| 2010/0008058 | A1 | 1/2010 | Saen et al. |
| 2010/0070696 | A1 | 3/2010 | Blankenship |
| 2010/0070782 | A1 | 3/2010 | Majewski et al. |
| 2010/0157644 | A1 | 6/2010 | Norman |
| 2010/0161918 | A1 | 6/2010 | Norman |
| 2010/0167100 | A1 | 7/2010 | Moore et al. |
| 2011/0231739 | A1 | 9/2011 | Kim |
| 2012/0023376 | A1 | 1/2012 | Jeddeloh |
| 2012/0079176 | A1 | 3/2012 | Sun et al. |
| 2012/0104578 | A1 | 5/2012 | Hu et al. |
| 2012/0130983 | A1 | 5/2012 | Ryan et al. |
| 2012/0204073 | A1 | 8/2012 | Whetsel |
| 2012/0273782 | A1 | 11/2012 | Goel et al. |
| 2012/0290793 | A1 | 11/2012 | Chung et al. |
| 2013/0031330 | A1* | 1/2013 | Jones et al. ................... 711/206 |
| 2013/0042060 | A1 | 2/2013 | Marukame et al. |
| 2013/0086353 | A1 | 4/2013 | Colgrove et al. |
| 2013/0257481 | A1* | 10/2013 | Metsis ........................... 326/101 |
| 2013/0292840 | A1 | 11/2013 | Shoemaker et al. |
| 2014/0013169 | A1 | 1/2014 | Kobla et al. |
| 2014/0085959 | A1 | 3/2014 | Saraswat et al. |
| 2014/0108891 | A1 | 4/2014 | Strasser et al. |
| 2014/0173113 | A1 | 6/2014 | Vemuri et al. |

OTHER PUBLICATIONS

Non-Final Office Action mailed May 14, 2014 for U.S. Appl. No. 13/726,145, 23 pages.
Final Office Action mailed Aug. 11, 2014 for U.S. Appl. No. 13/567,958, 27 pages.
Notice of Allowance mailed Aug. 25, 2014 for U.S. Appl. No. 13/726,145, 22 pages.
U.S. Appl. No. 13/328,393, filed Dec. 16, 2011, entitled "Memory Architecture for Read-Modify-Write Operations".
U.S. Appl. No. 13/567,945, filed Aug. 6, 2012, entitled "Stacked Memory Device With Metadata Mangement".
U.S. Appl. No. 13/567,958, filed Aug. 6, 2012, entitled "Stacked Memory Device With Helper Processor".
U.S. Appl. No. 13/726,143, filed Dec. 23, 2012, entitled "Die-Stacked Memory Device Providing Data Translation".
U.S. Appl. No. 13/726,144, filed Dec. 23, 2012, entitled "Quality of Service Support Using Stacked Memory Device With Logic Die".
U.S. Appl. No. 13/726,145, filed Dec. 23, 2012, entitled "Die-Stacked Memory Device With Reconfigurable Logic".
U.S. Appl. No. 13/726,146, filed Dec. 23, 2012, entitled "Cache Coherency Using Die-Stacked Memory Device With Logic Die".
David Patterson et al., "FP 14.1: Intelligent RAM (IRAM): Chips That Remember & Compute", 1997 IEEE International Solid-State Circuits Conference, Feb. 7, 1997, 2 pages.
Gabriel H. Loh, "3D-Stacked Memory Architectures for Multi-Core Processors", ISCA '08 Proceedings of the 35th Annual International Symposium on Computer Architecture, Jun. 2008, pp. 453-464.
J. Thomas Pawlowski, "Hybrid Memory Cube (HMC)", Micron Technologies, Aug. 4, 2011, 24 pages.
Intel Platform Brief "Intel Atom Processor E6x5C Series-Based Platform for Embedded Computing", http://newsroom.intel.com/servlet/jiveservlet/download/1512-31-3257/ProductBrief-IntelAtomProcessor_E600C_series_v2.pdf, Jan. 2010, 4 pages.
Stretch, Inc. Configurable Processors, http://www.stretchinc.com, Accessed Apr. 2, 2013, 1 page.
Nathan Brookwood, "AMD Fusion Family of APUs: Enabling a Superior, Immersive PC Experience", AMD White Paper: AMD Fusion Family of APUs, Mar. 2010, 8 pages.
"How Computers Work: The CPU and Memory", <http://homepage.cs.url.edu/faculty/wolfe/book/Readings/Reading04.htm> Feb. 1, 2002, 1 page.
N.S. Matlo, "Introduction to Microcoded Implementation of a CPU Architecture", <http://www.cs.ucsb.edu/~chong/154/Tan.pdf> Jan. 21, 1997, 12 pages.
Lixin Tao, "Interrupt Processing", <http://csis.pace.edu/~lixin/teaching/cs371/interrupt.pdf> Sep. 2002, 3 pages.
Shawn Hargreaves, "An elf in a box", <http://blogs.msdn.com/b/shawnhar/archive/2008/03/31/an-elf-in-a-box.aspx> Mar. 31, 2008, 5 pages.
Chris Rawson, "Mac 101: Integrated versus discrete graphics", <http://www.tuaw.com/2010/05/14/mac-101-integrated-versus-discrete-graphics/> May 14, 2010, 2 pages.
Matthew Hogan, "Silicon Interposers: building blocks for 3D-Ics", <http://electroiq.com/blog/2011/06/silicon-interposers-building-blocks-for-3d-ics/> Jun. 14, 2011, 6 pages.
Nigel Jacob, "Offloading IDS Computation to the GPU", 22nd Annual Computer Security Applications Conference (ACSAC'06), <http://www.acsac.org/2006/papers/74.pdf> Dec. 21, 2006, 10 pages.
Laura Tiffany, "How Many Computer Processors Do You Need?" <http://www.allbusiness.com/computing-information-technology/parallel-computing/12603535-1/html> Aug. 7, 2009, 2 pages.
QNX "Processes and Threads", <http://www.qnx.com/developers/docs/6.4.0/neutrino/getting_started/s1_procs.html> May 29, 2009, 20 pages.
Eric Chan, "GPU Gems 2" <http://http.developer.nvidia.com/GPUGems2_chapter22.html> Apr. 15, 2005, Chapter 22, 11 pages.
Yi Yang et al. "CPU-assisted GPGPU on fused CPU-GPU architectures", IEEE, Feb. 2012, 12 pages.
Debra Cook et al. "Secret Key Cryptography Using Graphics Cards", Columbia University Technical Report, Jan. 14, 2004, 14 pages.
Matthew Hogan et al. "Robust Verification of 3D-Ics: Pros, Cons and Recommendations", IEEE, Aug. 21, 2009, 6 pages.
Carlos Carvalho, "The Gap Between Processor and Memory Speeds", ICCA, 2002, 8 pages.
Christianto C. Liu et al. "Bridging the Processor-Memory Performance Gap with 3D IC Technology", IEEE vol. 22, Issue 6, Nov. 21, 2005, 9 pages.
Jon Stokes "Ask Ars: what is a CPU thread?" Ministry of Innovation of Technology, Apr. 12, 2011, 2 pages.
"Computer-System Operation", <http://siber.cankaya.edu.tr/operatingsystems/ceng328/node15.html> Feb. 14, 2011, 4 pages.
Non-Final Office Action mailed Dec. 20, 2013 for U.S. Appl. No. 13/567,945, 13 pages.
Non-Final Office Action mailed Feb. 27, 2014 for U.S. Appl. No. 13/567,958, 24 pages.
International Search Report and Written Opinion correlating to PCT/US2013/053599 dated Dec. 9, 2013, 8 pages.
International Search Report and Written Opinion correlating to PCT/US2013/053596 dated Dec. 9, 2013, 8 pages.
Non-Final Office Action mailed Jun. 20, 2014 for U.S. Appl. No. 13/567,945, 31 pages.
NPL Non-Final Office Action mailed Jan. 15, 2015 for U.S. Appl. No. 13/941,791, 33 pages.
Final Office Action mailed Oct. 31, 2014 for U.S. Appl. No. 13/567,945, 23 pages.
U.S. Appl. No. 14/551,147, filed Nov. 24, 2014, entitled "Die-Stacked Memory Device With Reconfigurable Logic".
Non-Final Office Action mailed Dec. 17, 2014 for U.S. Appl. No. 13/726,143, 13 pages.
Non-Final Office Action mailed Dec. 22, 2014 for U.S. Appl. No. 13/726,144, 14 pages.
Non-Final Office Action mailed Dec. 23, 2014 for U.S. Appl. No. 13/726,146, 14 pages.

\* cited by examiner

DIE-STACKED DEVICE WITH PARTITIONED MULTI-HOP NETWORK

BACKGROUND

1. Field of the Disclosure

The present disclosure relates generally to computing and memory devices and more particularly to multiple-die devices connected via an interposer.

2. Description of the Related Art

Communication and memory bandwidth and latency are significant bottlenecks in many processing systems. These performance factors may be improved to a degree by using die stacking techniques whereby multiple die implementing the processing system are disposed at a silicon substrate known as an interposer. The die may be stacked vertically using through-silicon vias (TSVs), or stacked horizontally using interconnects of the interposer, or a combination of both vertical stacking and horizontal stacking. In horizontal stacking, metal layers in the interposer typically are used to implement links to enable point-to-point communication between pairs of die. The use of point-to-point links to provide communication between horizontally-stacked die does not scale with the number of die. An increase in the number of die in a conventional horizontal-stacked system requires either an increase in the number of metal layers in the interposer, which significantly increases cost and complexity, or an increase in the lengths of certain traces of the interposer, which significantly increases power consumption, signal latency, and skew mismatch.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF PREFERRED EMBODIMENTS

FIGS. 1-6 illustrate example techniques for improved processing efficiency and lower cost in a processing system or other electronic assembly employing a multi-hop communication network. An electronic assembly includes horizontally-stacked die disposed at an interposer. The electronic assembly further may include vertically-stacked die. The stacked die may include memory devices, processing devices, and processing-support logic. In some embodiments, the multi-hop communication network is partitioned into a link partition and a router partition. The link partition is at least partially implemented in the metal layers of the interposer for horizontally-stacked die. The link partition may also be implemented in part by the intra-die interconnects in a single die and by the inter-die interconnects connecting vertically-stacked sets of die. In some embodiments the multi-hop network can be implemented in any of a variety of conventional network topologies, such as rings, meshes, torus, fat-trees and k-ary n-cubes. In other embodiments the multi-hop network may implement 'irregular' topologies, in which arbitrary routers and links are interconnected as dictated by the needs of the processing system. The router partition is implemented at some or all of the die disposed at the interposer and comprises the logic that supports the functions that route packets among the components of the processing system via the interconnects of the link partition. The router partition may implement fixed routing, or alternatively may be configurable using programmable routing tables or configurable logic blocks. The described network partitioning facilitates the implementation of multi-hop networks in horizontally-stacked processing systems despite the absence of logic in the interposer. In turn, a multi-hop network allows the use of a smaller number of interposer metal layers and shorter interposer traces to interconnect the die, thus improving network scalability as the number of stacked die increase.

Figure 1:
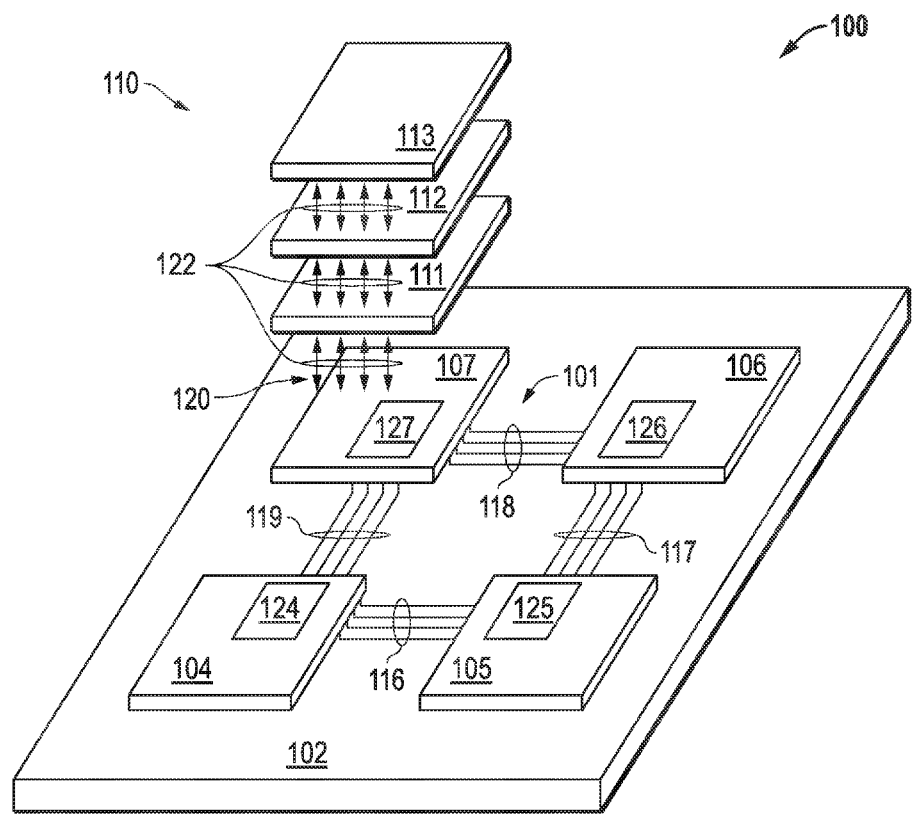
FIG. 1 is a diagram illustrating an exploded perspective view of an example die-stacked processing system employing a partitioned multi-hop network comprising a router partition and a link partition in accordance with some embodiments.

FIG. 1 illustrates die-stacked processing system 100 employing a multi-hop network comprising a router partition and a link partition in accordance with some embodiments. The processing system 100 can comprise any of a variety of computing systems, including a notebook or tablet computer, a desktop computer, a server, a network router, switch, or hub, a computing-enabled cellular phone, a personal digital assistant, and the like. The example processing system 100 includes a plurality of horizontally-stacked die 104, 105, 106, and 107 disposed at a surface of an interposer 102. The die 107 is the lowest layer of a vertical die stack 110 further including die 111, 112, and 113.

The illustrated die 104-107 and 111-113 may include any variety of processor cores and combinations thereof, such as central processing units (CPU) graphics processing units (GPU), digital signal processors (DSP), and the like. The illustrated die may also implement any variety of storage devices including, but not limited to, memory architectures such as dynamic random access memory (DRAM), static random access memory (SRAM), read-only memory (ROM), flash memory ferroelectric RAM (F-RAM) magneto-resistive RAM (MRAM) and the like. The illustrated die 104-107 and 111-113 can also include any peripheral devices such as northbridge and southbridge functions, input/output controllers, network interfaces and the like. The processing system 100 also can include a variety of other components not illustrated in FIG. 1, such as one or more external interfaces to display components, storage devices, input devices (e.g., a mouse or keyboard), and the like.

In some embodiment, the vertical die stack 110 comprises a stacked memory device wherein the stacked die 111-113 implement memory circuitry, such as DRAM, SRAM, ROM, and the like, and the die 107 implements hard-wired logic for accessing the memory circuitry of the stacked die 111-113, as well as routing logic as described below. The vertical die stack 110 may be fabricated using any of a variety of 3D integrated circuit fabrication processes. In one approach, the die 107 and 111-113 each are implemented as a separate substrate (e.g., bulk silicon) with active devices and one or more metal routing layers formed at an active surface. This approach can include a wafer-on-wafer process whereby a wafer comprising a matrix of dice is fabricated and thinned, and TSVs are etched through the bulk silicon. Multiple wafers are then stacked to achieve the illustrated layer configuration (e.g., a stack of four wafers comprising memory circuitry die for the three memory layers and a wafer comprising the logic die for a logic layer), aligned, and then joined via thermocompression. The resulting stacked wafer set is singulated to separate the individual 3D IC devices.

In a die-on-die process, the wafer implementing each corresponding layer is first singulated, and then the die are separately stacked and joined to fabricate the 3D IC devices. In a die-on-wafer approach, wafers for one or more layers are singulated to generate the die for one or more layers, and these die are then aligned and bonded to the corresponding die areas of another wafer, which is then singulated to produce the individual 3D IC devices. One benefit of fabricating the die 107 and 111-113 on separate wafers is that a different fabrication process can be used to fabricate the logic layer (die 107) than that used to fabricate the memory die (die 111-113). Thus, a fabrication process that provides improved performance and lower power consumption may be used to fabricate die 107 (and thus provide faster and lower-power interface logic and circuitry for the routing logic 127), whereas a fabrication process that provides improved cell density and improved leakage control may be used to fabricate the memory layers (die 111-113) (and thus provide more dense, lower-leakage bitcells for the stacked memory).

In another approach, the die 107 and 111-113 (as layers) are fabricated using a monolithic 3D fabrication process whereby a single substrate is used and each die layer is formed on a preceding die layer using a layer transfer process, such as an ion-cut process. The stacked memory devices also may be fabricated using a combination of techniques. For example, the logic layer (die 107) may be fabricated using a monolithic 3D technique, the memory layers (die 111-113) may be fabricated using a die-on-die or wafer-on-wafer technique, or vice versa, and the resulting logic layer stack and memory layer stack then may be bonded together and then to bonded to the interposer substrate.

During operation, the inter-die communications between the horizontally-stacked die 104-107 are conducted using the traces, vias, and other interconnects formed from one or more metal layers of the interposer 102. In a conventional system, a point-to-point link formed from interconnects in the interposer 102 between two die would be needed in order for the two die to communicate with each other. As noted above, this approach results in one or both of an excessive number of metal layers in the interposer or excessively long interconnects in order to accomplish the routing. To reduce or eliminate such issues, in some embodiments the processing system 100 implements a multi-hop network 101 composed of a router partition formed by routing logic at one or more of the horizontally-stacked die 104-107 and a link partition formed by the inter-device interconnects of the interposer 102 connecting the horizontally-stacked die 104-107 and the inter-die interconnects connecting the vertically-stacked die 107 and 111-113. The router partition comprises logic and other circuitry of the die that is used to make routing decisions to route packets on one or more hops over the inter-die interconnects and the intra-die interconnects forming the link partition. The link partition includes conductors coupling the transmit/receive circuitry of one die to the transmit/receive circuitry of another die ("inter-die interconnects"). These inter-die interconnects can include electrical conductors such as pads, pins, pin interfaces, metal layers, plated through holes, and vias on the interposer 102 or TSVs between vertically-stacked die. Such inter-die interconnects also can include optical conductors or a combination of both electrical and optical conductors. The link partition further can include the conductors coupling sets of transmit/receive circuitry on the same die ("intra-die interconnects"), such conductors including, for example, traces, vias, throughholes, pads, solder bumps, and the like.

To illustrate, in the example processing system 100 the horizontally-stacked die 104-107 are arranged on the interposer 102 in a ring network whereby die 104 is connected to die 105 via link 116, die 105 is connected to die 106 via link 117, die 106 is connected to die 107 via link 118, and die 107 is connected to die 104 via link 119. The links 116-119 are implemented in the one or more metal layers of the interposer 102. Moreover, the illustrated link partition of processing system 100 also includes a link 120 formed by a plurality of TSVs 122 or other conductors that interconnect the vertically-stacked die 107 and 111-113. In other embodiments, the link partition also may include on-die links that interconnect devices located on a particular die, as illustrated in greater detail below with reference to FIG. 3.

In some embodiments, the links 116-119 are implemented as single-ended or differential serial data links whereby message data is sent across the links 116-119 using a serial communication process. In this process, message data is sent one bit at a time over individual metal traces, vias, throughholes, wires, and other conductors that comprise links 116-119. In other embodiments, the links 116-119 are implemented as parallel data links whereby message data is sent across the links using a parallel communication process in which a plurality of message data bits are sent simultaneously over a plurality of metal traces, wires, vias or other conductors that comprise links 116-119.

In the depicted example, each of the horizontally stacked die 104-107 includes corresponding routing logic (identified as routing logic 124, 125, 126, and 127, respectively). The routing logic 124-127 together manage and route the message packets flowing through the multi-hop network 101. To this end, the routing logic at each die includes logic and control functions to implement one or more conventional or proprietary multi-hop routing for routing message data in association with the network links connected to die at which the routing logic is implemented. To illustrate, routing logic 124 is connected to links 116 and 119, routing logic 125 is connected to links 116 and 117, routing logic 126 is connected to links 117 and 118, and routing logic 127 is connected to links 118, 119, and 120. Some or all of the routing logic also can be coupled locally to the functional devices implemented on the corresponding die such as a CPU, GPU, DSP, memory controllers and the like. Thus, the routing logics 124-127 are coupled both to the devices on the same die, as well as to routers or other logic on other die that are disposed horizontally or stacked vertically on the interposer 102.

Each of routing logic 124-127 includes logic and other circuitry in support of this routing functionality, such logic including, for example, data input and output buffers, crossbar switches, scheduling logic, management and control logic, storage for routing tables, and configuration logic. The routing logic implemented by the routing logic 124-127 can implement fixed routing, or alternatively may be configurable using programmable routing tables or configurable logic blocks. An example implementation of the routing logic is described in greater detail below with reference to FIG. 4.

Although FIG. 1 shows an example implementation whereby the routing logic 127 is implemented on the die 107 disposed adjacent to the interposer 102 for the vertical die stack 110, in other embodiments the routing logic may 127 be implemented on another die of the vertical die stack (e.g., on die 111). That is, there may be one or more die disposed between the interposer 102 and the die implementing the routing logic 127 for the vertical die stack 110. Moreover, although FIG. 1 shows an example implementation whereby the routing logic 127 is implemented on a single die, in other implementations the routing logic 127 may be distributed across multiple die in the vertical die stack 110. For example, one portion of the routing logic 127, such as a crossbar switch and associated control logic, may be implemented at one die, while another portion of the routing logic 127, such as one or more routing tables, are implemented at another die of the vertical die stack 110. In this case, the link partition connecting the vertical die stack 110 to the multi-hop network 101 includes a plurality of TSVs 122 that connect the die in the vertical die stack 110. In some embodiments, the die (or die) of the vertical die stack 110 implementing the routing logic 127 are dedicated solely to the routing logic 127. In other embodiments, the die or die also may implement non-routing hardcoded logic or other devices, such as a CPU or GPU, a cache, memory, and the like.

The following example message traffic illustrates the use of the partitioned multi-hop network 101 in the processing system 100. For the purpose of this example, the die 104-106 implement processor cores, and the vertical die stack 110 is a stacked memory device whereby die 111-113 are stacked DRAM memory devices and die 107 implements a DRAM memory controller. The DRAM memory controller is coupled to the stacked memory devices via the TSVs 122. The memory controller operates to perform memory accesses to the data stored in the storage cell circuitry of the stacked DRAM memory devices in response to memory access requests from one or more of the processor cores. Examples of such requests include conventional memory read and write operations as well metadata management operations. Examples of such metadata management operations include, but are not limited to, address translation operations, data security or data integrity operations (e.g., checksum or error correcting code calculation or validation), garbage collection operations, memory utilization profiling, memory logging, and the like.

The following description of a process to service a memory write request illustrates an example operation of the partitioned multi-hop communication network in processing system 100. In the course of operation, a CPU at die 105 generates a memory write request, which includes an associated memory address, data to be written to the stacked memory device, and other control information such as the length of the write and byte masks. This information is formatted as a packet to be transmitted to from the CPU on die 105 to the memory controller on die 107. In generating the memory write request, the CPU provides the write request information, together with an indication of the destination node, to input buffers of the routing logic 125 (which is on the same die and thus the local routing logic for the CPU). In this example, the destination node is the memory controller device on die 107. The routing logic 125 inspects the packet header and extracts the destination node. The routing logic 125 next performs a table lookup to determine the next node in the route to the memory controller. In this example, the next node in the route to the memory controller is the routing logic 124 on die 104. Accordingly, the routing logic 125 on die 105 causes the write request packet to be placed in the output buffers corresponding to the link 116 connecting die 105 to die 104. The interface logic on die 105 then issues the packet by manipulating the physical interface (PHY) connected to the conductors that comprise link 116 to transmit signaling representative of the memory write request to the intermediate node on die 104. The conductors that comprise link 116 are implemented in the metal layers of interposer 102, as well as the metal contacts connecting the die 104 and 105 to the metal layers of the interposer 102. The transmission of signals on link 116 may be implemented using conventional differential techniques using two electrically complementary signals sent on two paired conductors for each bit lane. Alternatively, transmission may be implemented via single-ended techniques requiring a single conductor for each bit lane and referencing the signal level on that conductor against common voltage or ground.

The PHY on die 104 receives the signaling and buffers the memory write request information represented by the signaling. The routing logic 124 on die 104 inspects the buffered packet header and extracts the destination node. Since the final destination is not the local device on die 104, the routing logic 124 next performs a table lookup to determine the next node in the route to the memory controller. In this example, the next node in the path is the router on die 107. The routing logic 124 on die 104 therefore causes the write request packet to be placed in the output buffers corresponding to the link 119 connecting die 104 to die 107. The interface logic on die 104 then issues the packet by manipulating the physical interface (PHY) connected to the conductors that comprise link 119 connected to die 107 to transmit signaling representative of the memory write request.

The PHY on die 107 receives the signaling and buffers the memory request packet. The routing logic 127 on die 107 inspects the packet header and extracts the destination node. In this example the destination node matches the memory controller's node identification. The routing logic 127 therefore places the write request into input buffer of the memory controller device on die 107. The memory controller accesses the appropriate DRAM cells on die 111-113, storing the write data to the location of memory indicated by the signaled address, thereby completing the requested memory write operation which was initiated by the CPU on die 105.

Thus, as the example above illustrates, message data can be communicated between the die 105 and the die 107 without requiring a point-to-point link between die 105 and 107. Moreover, this same multi-hop routing approach permits communication between the die 104 and 106 without a point-to-point link between the two die. As such, the interposer 102 in the example of FIG. 1 need only support four inter-die links for the four die, rather than the six inter-die point-to-point links that would be necessitated in conventional approaches. With two fewer inter-die links to support, the interposer 102 can implement fewer metal layers and shorter or less-complex trace routing between the die.

Although a ring network arrangement is depicted in FIG. 1, the die of the processing system 100 can be implemented in any of a variety of network topologies, including mesh, torus, tree, n-cube and the like, or combinations thereof. To illustrate, the die 104-107 could be implemented in a hub-and-spoke arrangement whereby die 104 acts as the hub for routing all message data between 104, 106, and 107.

Figure 2:
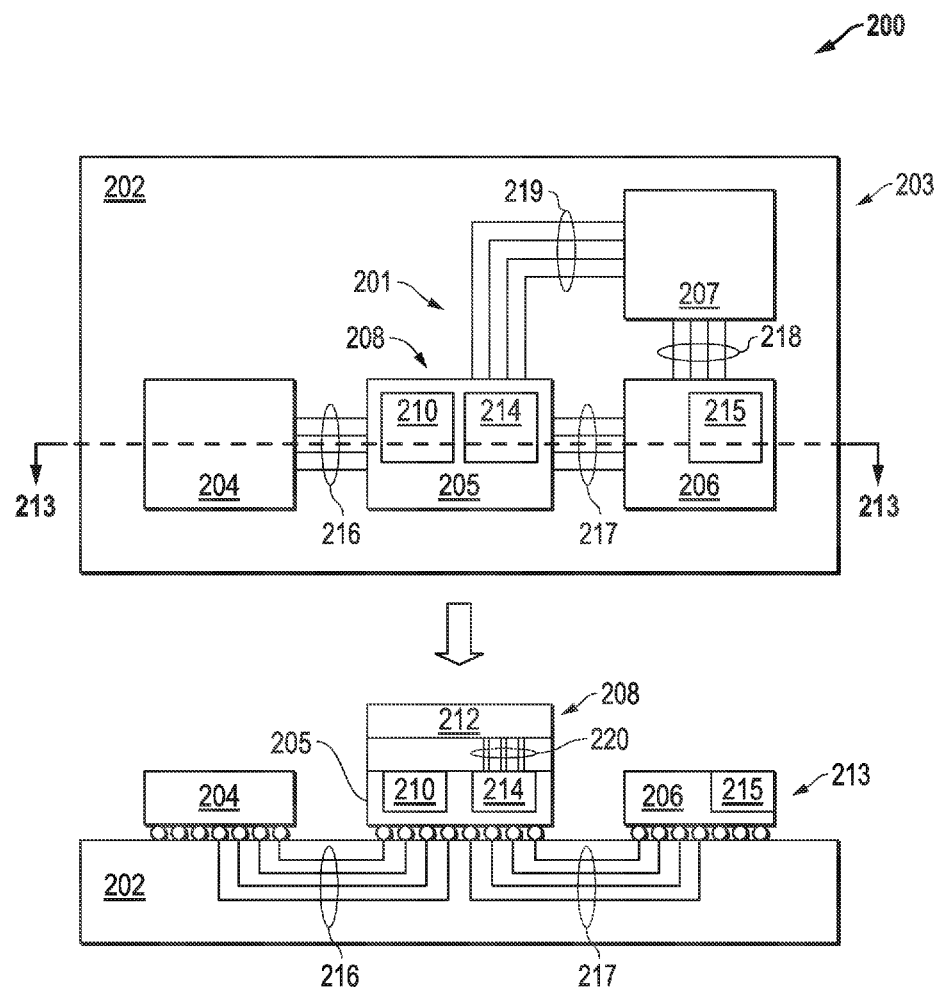
FIG. 2 is a diagram illustrating a plan view and a cross-section view of another die-stacked processing system employing a partitioned multi-hop network in accordance with some embodiments.

FIG. 2 illustrates both a plan view 203 and a cross-section view 213 of another example processing system 200 utilizing a partitioned multi-hop network in accordance with some embodiments. In the depicted example, the processing system 200 includes horizontally-stacked die 204, 206, 206, and 207 disposed at an interposer 202. The processing system 200 also includes a vertical die stack 208 comprising a die 210 stacked on the die 205 and a die 212 stacked on the die 210.

The die 204-207 are interconnected via a partitioned multi-hop network 201 comprising links 216, 217, and 218. The multi-hop network 201 further includes an inter-device link formed from the TSVs 222 interconnecting the die 205, 210, and 212 of the vertical stack 208. As illustrated by cross-section view 213, the inter-die links 216-218 each may be implemented at one or more metal layers of the interposer 202 and in the metal contacts connecting the die 204-207 to the interposer 202.

In the depicted example, link 216 connects die 204 and die 205, link 217 connects die 205 and 206, link 218 connects die 206 and die 207, and link 219 connects die 205 and 207. Further in this example, the link 219 is a side-band link that is used exclusively for communications between certain devices at die 205 and certain devices at die 207. That is, links 216, 217, and 218 form the link partition of the multi-hop network 201 and link 219 is not included in this multi-hop network. As such, die 204 and 207 are leaf nodes in the multi-hop network 201 and thus do not need to implement routing logic in this example network topology. To facilitate routing of message data among the die, the die 205 implements routing logic 214 and the die 206 implements routing logic 215.

The following example message traffic illustrates the use of the partitioned multi-hop network in the processing system 200. For the purpose of this example, die 204, 205 and 206 comprise processor cores that implement functions that control power management features that serve to reduce overall energy consumption. Examples of such power management functions include clock throttling, dynamic voltage control, CPU sleep states and the like. These functions may be configured, invoked and controlled in response to messages passed from one device to another over the network. These power management functions are used by the operating system software (OS) to trade-off power and system performance in a dynamic fashion in response to the system's processing load and overall utilization.

The following example of servicing a power management request serves to illustrate the operation of the partitioned communication network in processing system 200. In the course of operation, operating system (OS) software running on the CPU on die 212 determines that the CPU on die 204 should be placed into a "sleep" state in order to reduce system power consumption. The CPU on die 212 therefore generates a sleep request that includes the associated power management command ("sleep") together with other control information as needed such as the expected length of the sleep state. This sleep request is implemented as a packet of information to be transmitted from the CPU device on die 212 to the CPU device on die 204. In generating the sleep request, the OS software causes the sleep information packet together with an indication of the destination node to be written to interface logic of die 212. Interface logic on die 212 then issues the packet by manipulating the physical interface (PHY) connected to the conductors that comprise TSVs 220 to transmit signaling representative of the sleep request to the routing logic 214 on die 205. The routing logic 214 inspects the packet header and extracts the destination node. Using the destination node, the routing logic 214 performs a table lookup to determine the next node in the route to the destination. As a result of the table lookup, the routing logic 214 causes the sleep request packet to be placed in the output buffers corresponding to the link 216 which connects die 205 to devices implemented on die 204. The interface logic on die 205 then issues the sleep packet by manipulating the physical interface (PHY) connected to the conductors that comprise link 216 to transmit signaling representative of the sleep request to die 204. As shown on the cross-section, the conductors that comprise link 216 are implemented in the metal layers of interposer 202. The PHY on die 204 receives the signaling and buffers the sleep request information represented by the signaling. The interface logic on die 204 places the sleep request into input buffers available to the CPU and typically generates an interrupt notifying the CPU that a message has arrived. The CPU device on die 204 reads the message and performs the sleep function requested by signaled commands, thereby completing the requested sleep operation which was initiated by the OS running on the CPU device located on die 212.

Figure 3:
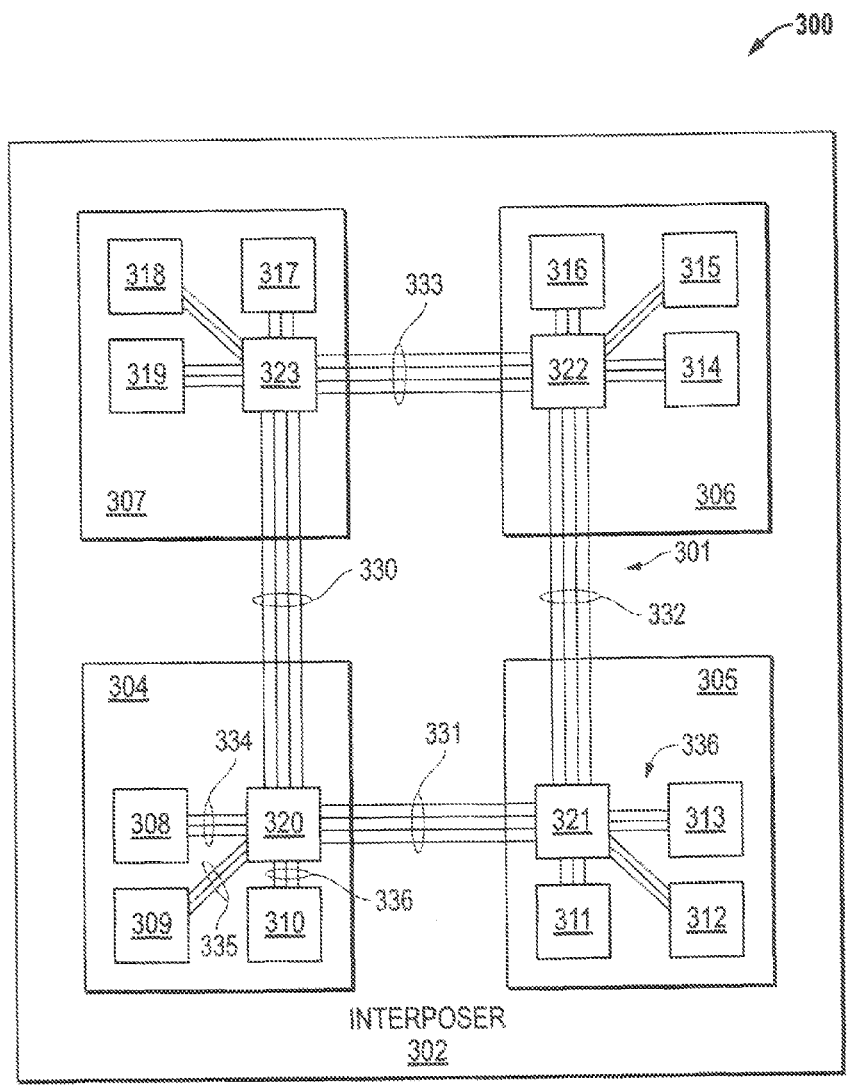
FIG. 3 is a diagram of another processing system employing a hybrid partitioned multi-hop network in accordance with some embodiments.

FIG. 3 illustrates a plan view of another example processing system 300 implementing a partitioned multi-hop network 301 in accordance with some embodiments. In this example, the partitioned multi-hop network 301 implements a link partition comprising a combination of intra-die links together with inter-die links. As illustrated, the processing system 300 comprises horizontally-stacked die 304, 305, 306, and 307 disposed at a surface of an interposer 302. Each die implements a plurality of devices, such as devices 308, 309, and 310 at die 304, devices 311, 312, and 313 at die 305, devices 314, 315, and 316 at die 306, and devices 317, 318, and 319 at die 307. These devices may include, but are not limited to CPUs, GPUs, DSPs, memory controllers, input/output controllers, storage devices, and the like.

The router partition of the partitioned multi-hop network 301 is implemented as routing logic 320, 321, 322, and 323 located at die 304, 305, 306, and 307, respectively. The link partition for the partitioned multi-hop network 301 includes a plurality of inter-device links, such as inter-device links 330, 331, 332, and 333, that interconnect the routing logic 320-323 in the depicted ring network topology and which are implemented in part by the various metal layers of the interposer 302. The link partition of the partitioned multi-hop network 301 further includes a plurality of intra-device communication links that connect the individual devices on a given die to the local routing logic on that die. For example, intra-device links 334, 335, and 336 connect the routing logic 320 to devices 308-310, respectively. These intra-device links are implemented as conductive interconnect structures in the various metal layers of the die.

The example processing system 300 illustrates the use of two different network topologies in same partitioned communication network. Intra-die communication is accomplished via a hub-and-spoke network topology (or point-to-point topology) whereby the routing logic serves as the hub of all message routing among the devices on the die and between the devices of the die and devices on other die. In contrast, inter-die communication is accomplished via a ring topology whereby each of the routing logic 320-323 is connected to its neighbor die via links 330-333 in a ring fashion.

The following example message traffic illustrates the use of a hybrid inter-die/intra-die partitioned multi-hop network in processing system 300. For the purpose of this example, devices 308-310 on die 304 and devices 314-316 on die 306 implement processor cores with associated memory caches (and thus are also referred to herein as processor cores 308-310 and 314-316). The processor cores implement cache management functions that serve maintain cache coherency and consistency in a multiple processor system with multiple caches. Examples of such cache management features include network messages to modify the state of particular cache block residing in the cache of another CPU In the course of operation the process has determined that a particular line in the cache of processor core 313 on die 305 needs to be invalidated in order to maintain a consistent view of memory. The cache line invalidation request includes the associated cache management command ("invalidate") together with the associated memory address to be invalidated. This information comprises a packet of information to be transmitted from the processor core 309 to the processor core 313.

In generating the invalidation request, the processor core 309 generates an invalidation request packet together with an indication of the destination node and places the invalidation request packet in the output buffers corresponding to link 335. Link 335 is implemented in the various metal layers of die 304 and connects of on-die routing logic 320. The local routing logic 320 inspects the packet header and extracts the destination node. The routing logic 320 next performs a table lookup to determine the next node in the route to processor core 313. In this example, the next node in the path is the routing logic 321 on die 305. The routing logic 320 on die 304 causes the invalidation request packet to be placed in the output buffers corresponding to the link 331. The interface logic on die 304 then issues the packet by manipulating the physical interface (PHY) connected to the conductors that comprise link 331 to transmit signaling representative of the cache line invalidation request to die 305.

The PHY on die 305 receives the signaling and buffers the invalidation request information represented by the signaling. The routing logic 321 inspects the buffered packet header an extracts the destination node and performs a lookup in its routing table. As a result of the table lookup, the routing logic 321 determines the destination node, processor core 313, is a local device. Accordingly, the router places the cache line invalidation packet into buffers available to the processor core 313 via an intra-device link 336. Logic on the processor core 313 reads the message and performs the cache line invalidation function requested by the signaled commands, thereby completing the requested operation which was initiated by the processor core device 309 located on die 304.

Figure 4:
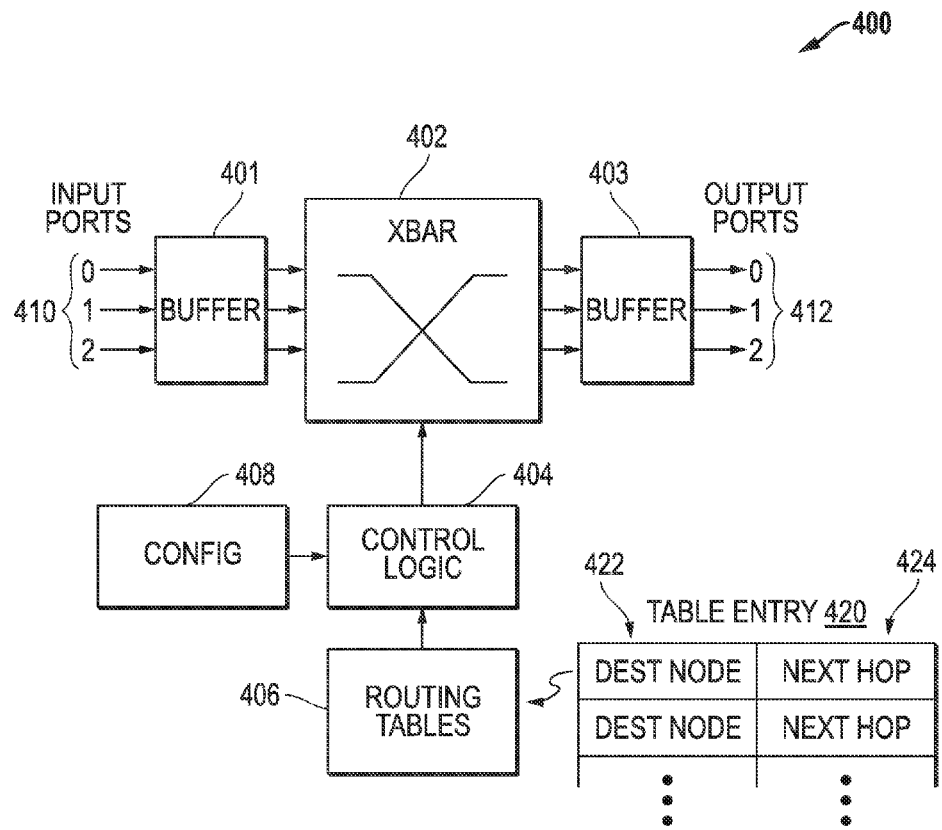
FIG. 4 is a block diagram illustrating example routing logic employed in a partitioned multi-hop network of a die-stacked processing system in accordance with some embodiments.

FIG. 4 illustrates an example implementation of routing logic as implemented in the example processing systems of FIGS. 1-3 in accordance with some embodiments. In the depicted example, routing logic 400 comprises an input buffer 401, a crossbar switch 402, an output buffer 403, control logic 404, one or more routing tables 406, and configuration block 408. The input buffer 401 is coupled to one or more input ports 410. Each input port 410 is coupled to a corresponding inter-device or intra-device link, and the input buffer 401 configured to buffer message data received via the corresponding inter-device link. Likewise, the output buffer 403 is connected to one or more output ports 412. Each output port 412 is coupled to a corresponding inter-device or intra-device link, and the output buffer 403 is configured to buffer message data received from the crossbar switch 402 for the corresponding link. The crossbar switch 402 contains multiplexers that switch packets flowing from input ports 410 to output ports 412 based on control signaling provided by the control logic 404. The control logic 404 uses configuration parameters specified by the configuration block 408 and routing information represented in the one or more routing tables 406 to control the crossbar switch 402 to effect a particular routing of input message data from an input port to an output port. The control logic 404 inspects incoming message headers, performs lookups in one or more routing tables 406 to determine the next hop, and controls the crossbar switch to forward the data to the proper output port 412. The control logic 404 also manages virtual channels, implements arbitration and filtering per the configuration info of the configuration block 408, and otherwise implements components of one or more routing protocols.

In some embodiment, the routing table 406 provides routing information for packets that pass though the routing logic 400. To illustrate, the routing table 406 can be implemented as a plurality of table entries 420, each table entry 420 associated with a corresponding destination node address and including an index field 422 representing the destination node address and a next node field 424 specifying the address of the address of the next node according to the routing path set between a source node and a destination node. Table entry 420 may also contain other fields used by the control logic such as alternate routes, path length, link error status and the like. The next node field 424 may be the address of the next node for a multi-hop route or a port connected to the local node if the local node is the final destination. In some embodiments, the table entries 420 of table 420 may be preset or otherwise fixed to implement fixed routing schemes. To illustrate, the table 420 may be implemented in ROM or as hardcoded logic.

In other embodiments, the table 420 may be writeable or otherwise programmable to implement varying routes or to enable reconfiguration for different numbers or arrangements of die or network topologies. To illustrate, in a programmable implementation the table 420 may be implemented in any of a variety of configurable storage elements, such as a register file, in RAM or flash memory, and the like. These configurable elements and writeable table entries may managed by a number of elements, including an operation system, hypervisor, a basic input/output system (BIOS), firmware or a combination thereof. As an example, during system boot-up the operating system may write the configurable elements to accomplish the required routes required by a known, fixed topology. In other scenarios the topology of the partitioned network may not be known beforehand, with varying numbers of routers and connections that vary between different versions and implementations of the physical system. In this case, system firmware or BIOS may inspect the router and interconnection topology to discover the implemented network topology. Having done so, the system BIOS or firmware then writes the configurable elements and tables in each router to accomplish the required network routing. In some scenarios, instead of being configured once at system boot-up, the routing configuration may be changed dynamically. In response to detection of errors on given link or hardware failures in a given router, the operation system, hypervisor or system BIOS may re-write the router's configurable elements to route around such failures. The operating system or hypervisor may also reconfigure the router to implement quality of service policies such as network and memory bandwidth guarantees Although FIG. 4 illustrates an implementation whereby one or more routing tables 406 are used to specify the routing paths to be implemented by the router partition of a multi-hop network, in other implementations the router partition may use hardwired logic to specify routing paths where the network topology is known and fixed at the time of manufacture.

Figure 5:
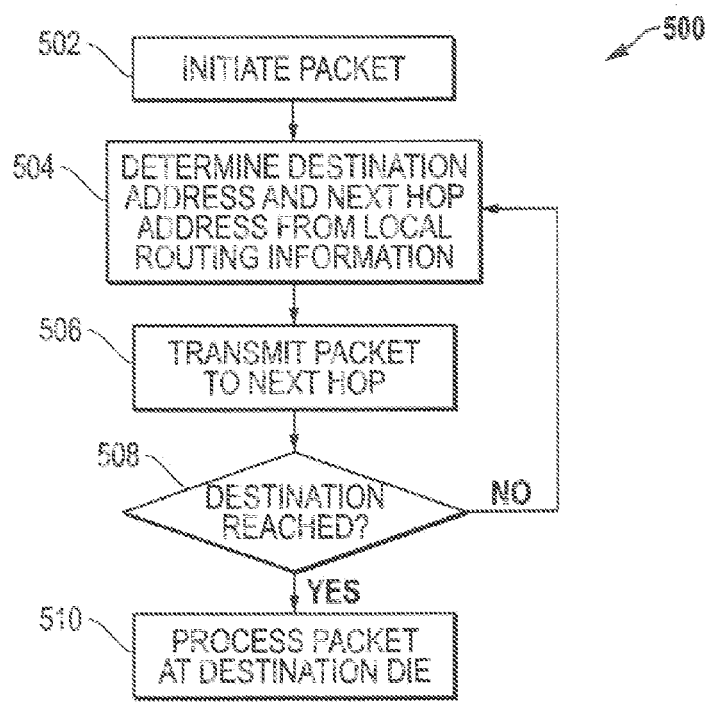
FIG. 5 is a flow diagram illustrating an example method for multi-hop packet routing in a die-stacked processing system in accordance with some embodiments.

FIG. 5 illustrates a flow diagram of an example method 500 of performing a multi-hop packet routing in a processing system utilizing a partitioned multi-hop network in accordance with some embodiments. For ease of illustration, the method 500 is described in the context of the routing logic 400 shown in FIG. 4.

At block 502, a device at a die (the "source die") initiates the transmission of message data to a destination device on another die (the "destination die") by generating a packet containing the message data and a destination address associated with one or both of the destination device or the destination die. If the source die includes only a single link of the multi-hop network, the packet is supplied for transmission to this single link by default. Otherwise, if the source die has more than one link of the multi-hop network, at block 504 the control logic 404 at the routing logic 400 at the source die inspects the packet header and performs a lookup in table 406 to determine the next hop in the routing path, and thus to determine the output port 412 connected to the link that leads to the next hop. At block 506, the control logic 404 controls the crossbar switch 402 to route the packet to the determined output port 412, whereupon the packet is transmitted over the corresponding link to the next hop.

At block 508, the die identified as the next hop receives the packet and determines if it is the final destination by inspecting the destination address of the packet. If the final destination has not been reached, the routing logic 400 at the receiving die performs the process of blocks 504, 506, and 508 to determine the next hop in the routing path and route the packet to the determined next hop accordingly. The process of blocks 504-508 is repeated until the packet reaches the final destination. When the final destination has been reached, at block 510 the control logic 404 controls the crossbar switch 402 to direct the packet to the output port 412 used for local packet traffic (that is, for packets intended for the devices of the local die), whereupon the packet is unloaded from the output buffer 403 and processed at the destination device.

In some embodiments, the apparatus and techniques described above are implemented in a system comprising one or more integrated circuit (IC) devices (also referred to as integrated circuit packages or microchips), such as the IC devices of FIGS. 1-3. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 6:
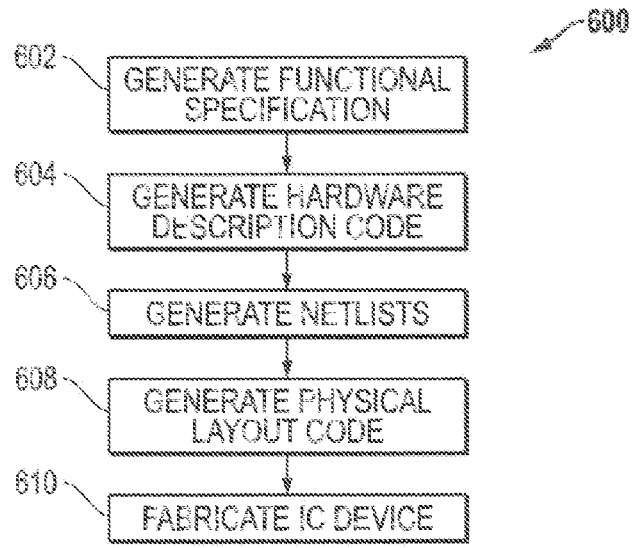
FIG. 6 is a flow diagram illustrating a method for designing and fabricating an integrated circuit (IC) device in accordance with some embodiments.

FIG. 6 is a flow diagram illustrating an example method 600 for the design and fabrication of an IC device implementing one or more embodiments. As noted above, the code generated for each of the following processes is stored or otherwise embodied in computer readable storage media for access and use by the corresponding design tool or fabrication tool.

At block 602 a functional specification for the IC device is generated. The functional specification (often referred to as a micro architecture specification (MAS)) may be represented by any of a variety of programming languages or modeling languages, including C, C++, SystemC, Simulink, or MATLAB.

At block 604, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 606 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 608, one or more EDA tools use the netlists produced at block 606 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GD- SII) format. Data in this format typically represents geometric shapes, text labels, and other information about the circuit layout in hierarchical form.

At block 610, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An electronic assembly comprising:
   an interposer;
   a plurality of die disposed at a surface of the interposer and connected via one or more metal layers of the interposer; and
   a multi-hop network to route packets among the plurality of die, the multi-hop network comprising a router partition and a link partition, the routing partition comprising routing logic disposed at each die of at least a subset of the plurality of die and the link partition comprising the one or more metal layers of the interposer.

2. The electronic assembly of claim 1, wherein the plurality of die comprises a vertically-stacked set of die.

3. The electronic assembly of claim 2, wherein:
   the vertically-stacked set of die includes a first die of the subset;
   the link partition further includes on-die interconnects for the vertically-stacked set of die; and
   the routing logic of the first die is further to route packets among devices of the vertically-stacked set of die using the on-die interconnects.

4. The electronic assembly of claim 3, wherein the on-die interconnects include through-silicon vias (TSVs) interconnecting multiple die of the vertically-stacked set.

5. The electronic assembly of claim 3, wherein:
   at least one die of the vertically-stacked set is disposed between the first die and the surface of the interposer; and
   the link partition comprises one or more through-silicon vias (TSVs) of the vertically-stacked set that connect the first die to the interposer.

6. The electronic assembly of claim 3, wherein the first die further includes circuitry for at least one of: non-routing hard-coded logic; memory; and a processor.

7. The electronic assembly of claim 2, wherein the vertically-stacked set of die includes a first die of the subset and a second die of the subset, the first die implementing a first portion of the routing logic and the second die implementing a second portion of the routing logic.

8. The electronic assembly of claim 1, wherein the plurality of die includes a first die and a second die, the first die included in the subset and implementing the routing logic and the second die absent the routing logic, the first die and second die coupled via a point-to-point link comprising wiring of one or more metal layers of the interposer.

9. The electronic assembly of claim 1, wherein the routing logic is hard-coded.

10. The electronic assembly of claim 1, wherein the routing logic is programmable.

11. The electronic assembly of claim 1, wherein the routing logic comprises a routing table.

12. The electronic assembly of claim 11, wherein the routing table is programmable.

13. A method comprising:
    transmitting a first packet from a first die of a plurality of die to a second die of the plurality of die via a first link, the plurality of die connected in a multi-hop network via metal layers of an interposer and the first link implementing one or more metal layers of the interposer;
    determining, using routing logic of the second die, a third die as the next hop in a routing path for the first packet; and
    transmitting the first packet from the second die to the third die via a second link, the second link implementing one or more metal layers the interposer.

14. The method of claim 13, wherein:
    the second die is one of a plurality of die of a vertically-stacked set of die; and
    the method further comprises:
       receiving, at routing logic of the second die, a second packet from another die of the vertically-stacked set of die via a third link comprising through-silicon vias of the vertically-stacked set of die;
       determining, using the routing logic of the second die, a fourth die as the next hop in a routing path for the second packet; and
       transmitting the second packet from the second die to the fourth die via a fourth link, the fourth link implementing one or more metal layers of the interposer.

15. The method of claim 13, wherein determining the third die as the next hop in the routing path for the first packet comprises determining the third die as the next hop using a routing table associated with the routing logic.

16. The method of claim 15, further comprising:
    programming the routing table.

* * * * *